United States Patent
Gupta et al.

(10) Patent No.: US 9,627,962 B2
(45) Date of Patent: Apr. 18, 2017

(54) FAST BLOCKING SWITCH

(71) Applicant: Texas Instruments Incorporated, Dallas, TX (US)

(72) Inventors: Vishal Gupta, Bangalore (IN); Ganapathi Shankar, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 14/642,735

(22) Filed: Mar. 9, 2015

(65) Prior Publication Data

US 2016/0268892 A1  Sep. 15, 2016

(51) Int. Cl.

| H03K 17/00 | (2006.01) |
|---|---|
| H02M 3/07 | (2006.01) |
| H03K 17/0412 | (2006.01) |
| H03K 17/082 | (2006.01) |
| H02M 1/00 | (2006.01) |
| H03K 17/08 | (2006.01) |

(52) U.S. Cl.
CPC ........ *H02M 3/07* (2013.01); *H03K 17/04123* (2013.01); *H03K 17/0822* (2013.01); *H02M 2001/0029* (2013.01); *H02M 2001/0048* (2013.01); *H03K 2017/0806* (2013.01); *H03K 2217/0009* (2013.01); *H03K 2217/0054* (2013.01)

(58) Field of Classification Search
CPC .......... H03K 17/005; H03K 17/04106; H03K 17/063; H03K 17/6871
USPC ........................................................ 327/408
See application file for complete search history.

(56) References Cited

U.S. PATENT DOCUMENTS

| 7,038,522 | B2* | 5/2006 | Fauh | H02J 1/08 307/80 |
|---|---|---|---|---|
| 7,893,560 | B2* | 2/2011 | Carter | H02J 1/10 307/64 |
| 8,044,639 | B2* | 10/2011 | Tamegai | H02J 7/0055 307/43 |
| 8,937,504 | B2* | 1/2015 | Blanken | A61N 1/36185 327/394 |
| 8,963,614 | B2* | 2/2015 | Lee | H03K 17/005 327/408 |
| 8,994,440 | B2* | 3/2015 | Ryu | G11C 8/08 327/407 |

* cited by examiner

*Primary Examiner* — Jeffrey Zweizig
(74) *Attorney, Agent, or Firm* — William B. Kempler; Charles A. Brill; Frank D. Cimino

(57) ABSTRACT

A fast blocking switch includes, for example, an energy storage device, a first power switch and a second power switch. The energy storage device stores a charge for fast activation of the switches. The first switch is operable for coupling input current to an output terminal in response to the coupling of a potential supplied by the stored charge to a control terminal of the first switch. The second switch is operable for coupling a limited amount of the input current to the output terminal in response to the coupling of a potential supplied by the stored charge to a control terminal of the second switch.

19 Claims, 4 Drawing Sheets

US 9,627,962 B2

FAST BLOCKING SWITCH

BACKGROUND

Many applications of integrated circuits are embodied within an integrated system that includes multiple power supplies. In some of these applications, two or more such power supplies are arranged in a "wire-OR" configuration where at least one voltage output of each power supply is coupled together to provide a voltage output that can supply a current greater than the current capable of being supplied by any one of the participating power supplies. During operation of the integrated system, differing amounts of currents are required at different points in time. At various points in time, the required current can be greater or less than the amount provided by a given participating power supply. Accordingly, participating power supplies are switched off (to save power consumption), or turned on (to provide more power), as needed during different points of time during operation. Blocking circuitry is used in combination with the participating power supplies to minimize voltage disturbances (e.g., that can adversely affect the operation of the integrated system) that occur when switching on and off a participating power supply. However, such blocking circuitry often increases cost, complexity, and power consumption of the integrated system.

SUMMARY

The problems noted above can be solved using a fast blocking switch that includes, for example, an energy storage device, a first power switch and a second power switch. The energy storage device stores a charge for fast activation of the switches. The first switch is operable for coupling input current to an output terminal in response to the coupling of a potential supplied by the stored charge to a control terminal of the first switch. The second switch is operable for coupling a limited amount of the input current to the output terminal in response to the coupling of a potential supplied by the stored charge to a control terminal of the second switch; wherein the second switch is different from the first switch. The control terminal of the second switch is also operable (e.g., as a charge storage element) to provide (e.g., additional) charge to the control terminal of the first switch (e.g., for faster turn-on of the first switch).

This Summary is submitted with the understanding that it is not be used to interpret or limit the scope or meaning of the claims. Further, the Summary is not intended to identify key features or essential features of the claimed subject matter, nor is it intended to be used as an aid in determining the scope of the claimed subject matter.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be example of that embodiment, and not intended to intimate that the scope of the disclosure, including the claims, is limited to that embodiment.

Certain terms are used throughout the following description—and claims—to refer to particular system components. As one skilled in the art will appreciate, various names may be used to refer to a component or system. Accordingly, distinctions are not necessarily made herein between components that differ in name but not function. Further, a system can be a sub-system of yet another system. In the following discussion and in the claims, the terms "including" and "comprising" are used in an open-ended fashion, and accordingly are to be interpreted to mean "including, but not limited to . . . ." Also, the terms "coupled to" or "couples with" (and the like) are intended to describe either an indirect or direct electrical connection. Thus, if a first device couples to a second device, that connection can be made through a direct electrical connection, or through an indirect electrical connection via other devices and connections. The term "portion" can mean an entire portion or a portion that is less than the entire portion. The term "calibration" can include the meaning of the word "test." The term "input" can mean either a source or a drain (or even a control input such as a gate where context indicates) of a PMOS (positive-type metal oxide semiconductor) or NMOS (negative-type metal oxide semiconductor) transistor. The term "pulse" can mean a portion of waveforms such as "squarewave" or "sawtooth" waveforms.

Figure 1:
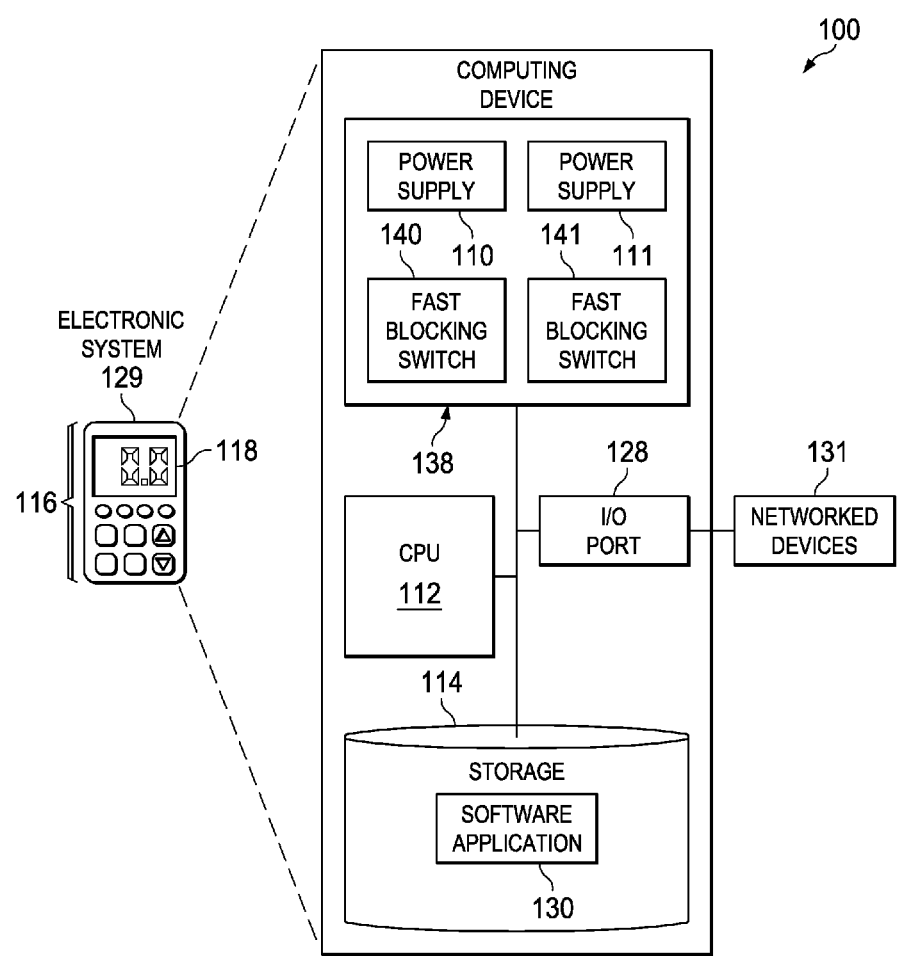
FIG. 1 shows an illustrative electronic device in accordance with example embodiments of the disclosure.

FIG. 1 shows an illustrative computing device 100 in accordance with embodiments of the disclosure. For example, the computing device 100 is, or is incorporated into, or is coupled (e.g., connected) to an electronic system 129, such as a computer, electronics control "box" or display, communications equipment (including transmitters or receivers), or any type of electronic system operable to process information.

In some embodiments, the computing device 100 comprises a megacell or a system-on-chip (SoC) which includes control logic such as a CPU 112 (Central Processing Unit), a storage 114 (e.g., random access memory (RAM)) and a power supply 110. The CPU 112 can be, for example, a CISC-type (Complex Instruction Set Computer) CPU, RISC-type CPU (Reduced Instruction Set Computer), MCU-type (Microcontroller Unit), or a digital signal processor (DSP). The storage 114 (which can be memory such as on-processor cache, off-processor cache, RAM, flash memory, or disk storage) stores one or more software applications 130 (e.g., embedded applications) that, when executed by the CPU 112, perform any suitable function associated with the computing device 100.

The CPU 112 comprises memory and logic that store information frequently accessed from the storage 114. The computing device 100 is often controlled by a user using a UI (user interface) 116, which provides output to and receives input from the user during the execution the software application 130. The output is provided using the display 118, indicator lights, a speaker, vibrations, and the like. The input is received using audio and/or video inputs (using, for example, voice or image recognition), and electrical and/or mechanical devices such as keypads, switches, proximity detectors, gyros, accelerometers, and the like.

The CPU 112 and power supply 110 are coupled to I/O (Input-Output) port 128, which provides an interface that is configured to receive input from (and/or provide output to) networked devices 131. The networked devices 131 can include any device (including test equipment) capable of point-to-point and/or networked communications with the computing device 100. The computing device 100 is typically coupled to peripherals and/or computing devices, including tangible, non-transitory media (such as flash memory) and/or cabled or wireless media. These and other input and output devices are selectively coupled to the computing device 100 by external devices using wireless or cabled connections. The storage 114 is accessible, for example, by the networked devices 131. The CPU 112, storage 114, and power supply 110 are also optionally coupled to an external power supply (not shown), which is configured to receive power from a power source (such as a battery, solar cell, "live" power cord, inductive field, fuel cell, capacitor, and the like).

The computing device 100 includes a power module 138. The power module 138 includes at least two power supplies such as power supplies 110 and 111. The power supplies 110 and 111 are arranged having at least one voltage output where each output is mutually coupled (e.g., connected) in a wire-OR configuration using fast blocking switches (fast B-gate) 140 and 141. The fast blocking switches are arranged to provide a fast turn-on of the blocking FET to minimize voltage droop at the voltage output that initially occurs when coupling the outputs of participating power supplies together. The fast blocking switches are quickly turned on using charge selectively coupled from internal capacitor storage. In an embodiment, the use of one or more internal capacitors avoids cost, pin terminals, complexity, and size associated with external capacitors.

The power supplies 110 and 111 include power generating and control components for generating power to enable the computing device 100 to execute the software application 130. For example, the power supplies 110 and 111 provide one or more power switches, each of which can be independently controlled, that are operable to supply power at various voltages to various components of the computing device 100. Both power supplies 110 and 111 are optionally in the same physical assembly as each other.

The computing device 100 optionally operates in various power-saving modes (such as a sleep mode) wherein individual voltages of the power supplies 110 and 111 are supplied (and/or turned off) in response to power control signals. The power control signals are generated by (or in response to) a power supply controller (such as CPU 112) in accordance with system operating requirements. The power supplies 110 and 111 can be individually and selectively turned on or off in response to the power control signals.

Figure 2:
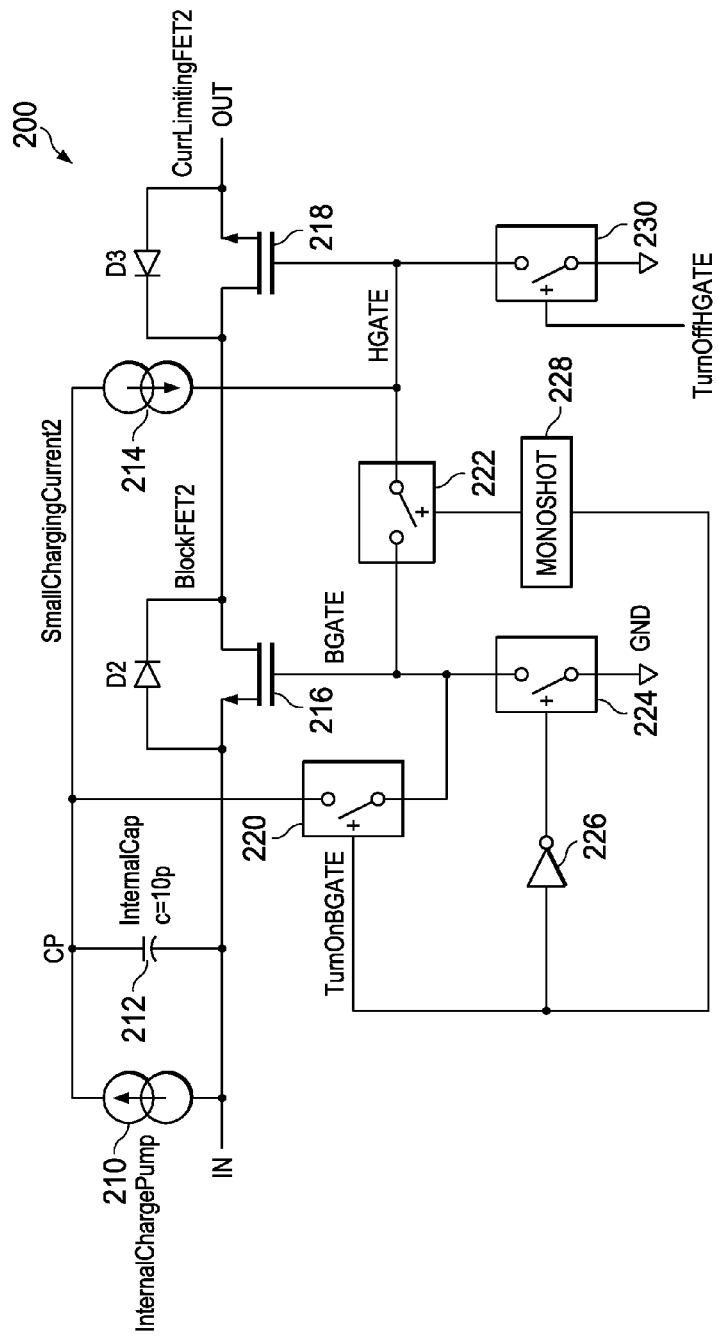
FIG. 2 is a schematic of a fast blocking switch in accordance with example embodiments of the disclosure.

FIG. 2 is a schematic of a fast blocking switch in accordance with example embodiments of the disclosure. The fast blocking switch 200 is a fast blocking switch such as fast blocking switch 140 or 141. The fast blocking switch 200 includes an internal charge pump 210, an internal capacitor 212, a small internal charge pump 214, an NMOS blocking switch 216, an NMOS current limiting switch 218, a B-gate switch 220, an H-gate switch 222, an inverter 226, a B-gate off switch 224, a monoshot (e.g., oneshot pulse generator) 228, and an H-gate off switch 230. Such included components are typically formed on a common substrate.

The fast blocking switch 200 is operable to store a charge in one or more internal capacitors and to apply the stored charge to the gates of the NMOS blocking switch 216 and NMOS current limiting switch 218 when activating (e.g., closing) the switches 216 and 218. The stored charge helps to rapidly overcome the relatively high source-to-gate capacitances associated with the NMOS blocking switch 216. (Depending on context, the term "switch" as used herein includes the meaning of a device that is operable for limiting a variable amount of current, including devices that generate a continuously variable amount of current in response to a control signal.)

In operation, the fast blocking switch 200 receives power from a participating power supply at node IN. The blocked power supply has, for example, a voltage output that is blocked by the NMOS blocking switch 216 of the fast blocking switch 200. In an initial state (e.g., where the power supply is blocked), the NMOS blocking switch 216 is turned off (e.g., in a blocking state) in response to the closing of the B-gate off switch 224. The NMOS current limiting switch 218 is turned on (e.g., in a conducting state) in response to the small charging current 214 pulling the control terminal of 218 high and the H-gate off switch 230 being open. Accordingly, the fast blocking switch 200 supplies power at node OUT (e.g., only) through the body diode of the NMOS blocking switch 216 and the participating power supply is blocked.

The power received at node IN is used by the fast blocking switch 200 to energize the internal charge pump 210. When energized, the internal charge pump 210 provides charge for charging the internal capacitor 212 and current for energizing the small internal charge pump 214. The small internal charge pump 214 provides a relatively small current that, if accumulated, (e.g., slowly) turns on (and/or maintains in an on state) the NMOS current limiting switch 218.

When the blocked power supply is to be "brought online" (e.g., have power coupled to the node OUT), the Turn On B-Gate (TurnOnBGATE) signal is asserted in accordance with the power control signals (e.g., which are in turn generated in accordance with system power requirements). In response to the assertion of the Turn On B-Gate signal, the B-gate switch 220 is closed, which couples charge stored in internal capacitor 212 to the gate of the NMOS blocking switch 216. The inverter 226 negates the asserted Turn On B-Gate signal and opens the B-gate switch 220 off switch 224 in response. However, since the internal capacitor 212 is relatively small (e.g., compared to the high source-to-gate capacitances associated with the NMOS blocking switch 216), the internal capacitor 212 by itself does not store sufficient charge for turning on the NMOS blocking switch 216 (e.g., even when the switch 220 is turned on).

In response to the assertion of the Turn On B-Gate signal, the monoshot 228 maintains (e.g., closes and maintains) the H-gate switch 222 in a closed state for a selected period of time by generating a pulse having a momentary active period of the selected period of time. At the expiration of the selected period of time, the monoshot 228 opens the H-gate switch 222. When the H-gate switch 222 is closed, the charge stored in the source-to-gate region of the NMOS current limiting switch 218 helps to overcome capacitance associated with the source-to-gate region of the NMOS blocking switch 216 such that the NMOS blocking switch 216 can be more quickly turned on.

The charge supplied by the internal NMOS current limiting switch 218 is applied to the gate of the NMOS blocking switch 216 at a rate (e.g., current level) that is substantially higher than the current supplied by the small internal charge pump 214. In an embodiment, the gate of the NMOS blocking switch 216 is charged at a rate that is at least around 10 times faster than the rate at which the small internal charge pump 214 charges the gate of the NMOS current limiting switch 218.

Figure 3:
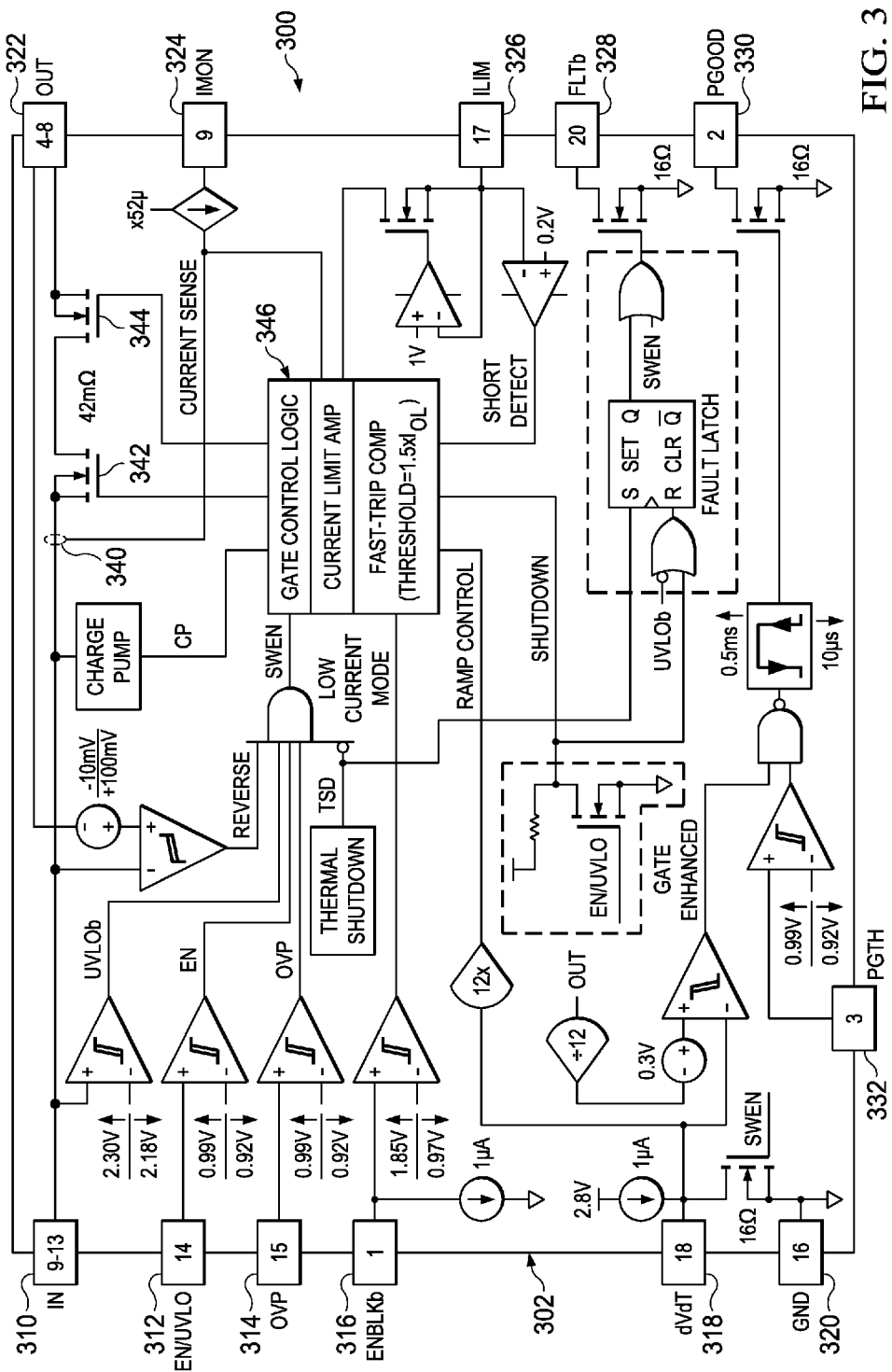
FIG. 3 is a pin-out block diagram of a fast blocking switch in accordance with example embodiments of the disclosure.

FIG. 3 is a pin-out block diagram of a fast blocking switch in accordance with example embodiments of the disclosure. The fast blocking switch 300 is a fast blocking switch such as fast blocking switch 200. The fast blocking switch 300 includes a substrate 302 upon which the blocking switch 300 is formed. The blocking switch 300 includes pins 310, 312, 314, 316, 318, 320, 322, 324, 326, 328, 330, and 332. Such pins each optionally include multiple terminals arranged in parallel.

Pin 310 (IN) is coupled to the output of a power supply and is arranged to receive a current from the power supply. The amperage (e.g., amount of current) supplied by the participating power supply is detected by sensor 340 and an indication of the amperage is conveyed to controller 346. The controller 346 is arranged to control the blocking switch 342 and the current limiting switch 344. Switches 342 and 344 are arranged in series (e.g., where the drain of switch 342 is connected to the drain of switch 344) and work together to block and/or limit the current (received at pin 310) that is coupled to pin 322 (OUT).

Each of the pins (such as Pins 310 and 322) are optionally multiple physical pins that are arranged in parallel. For example, pins 310 and 322 each comprise four physical pins arranged in parallel such that, for example, the effect of electrical resistance in a high current path (e.g., which includes any of a pin, terminal, pad, trace, wire, node, line and the like) is minimized.

The pin 310 (IN) is operable to support internal undervoltage-lockout (UVLO) circuitry. Control circuitry (including controller 346, for example) is arranged to disable the fast blocking switch when the IN terminal voltage falls below a internal UVLO Threshold ($V_{UVR}$). The internal UVLO threshold typically has a hysteresis of 115 mV.

Pin 312 is a terminal used to program an Enable and Adjusting Undervoltage Lockout (EN/UVLO) feature where the pin 312 controls the ON/OFF state of FET transistors such as switches 342 and 344. A voltage (e.g., in the range of around $0.6<V_{EN/UVLO}<1.0$ volts) on pin 312 turns off (e.g., opens) the internal MOSFET, which disconnects (e.g., blocks) pin 310 (IN) from pin 322 (OUT). Further, an applied voltage below 0.6V turns-off the fast blocking switch 300 such that the fast blocking switch 300 enters a shutdown mode. During the shutdown, the quiescent current ($I_Q$) is less than around 20 uA (microamperes), such that power loss is minimized.

The pin 312 (EN/UVLO) is programmable for "undervoltage lock out" operation by the use of an external resistor divider from supply to EN/UVLO to GND. Accordingly, pin 312 has multiple functions and serves to operate as an under voltage monitor and to promote quick turn off of the internal FETs in case of power failure or under-voltage event, In such events, the fast blocking switch 300 also asserts a fault (FLTb) flag, which is presented at pin 328.

Accordingly, the fast blocking switch 300 is suited for power supply wire-ORing applications (e.g., applications that combine currents from separate power-generating supplies), where the output pins of multiple (e.g., "N," where N is an integer greater than 1) fast blocking switches (e.g., fast blocking switches 300) are coupled together. The amount of current passed through a particular fast blocking switch is conveyed to an external controller (e.g., that is formed on a substrate other that substrate 302) that is operable to individually control each of the multiple fast blocking switches (see below with respect to FIG. 5, for example).

The fast blocking switch 300 is operable to control the in-rush current to a load (e.g., coupled to the output pin 322) upon insertion of a circuit card into a live backplane or other "hot" power source. Limiting the in-rush current (e.g., via current-limiting switch 344) limits the voltage droop on the backplane's supply voltage to avoid "brown outs" and low-voltage induced automatic resets of the system power. Similarly, controlling the slew rate (for example, the first derivative with respect to time: dVdT) helps to minimize conductive and radiative interference. For systems where load is present during start-up, the current is restricted from exceeding the maximum current limit set by a limiting resistor that is chosen in accordance with a particular application. The limiting resistor is externally coupled between the ILIM (current limiting) pin 326 and ground.

High in-rush currents often occur when "hot plugging" (e.g., plugging in a device to a system when the system is in a powered-up state). The fast blocking switch 300 is operable to regulate the inrush current in accordance with a programmable output slew rate control. For example, an external capacitor connected between the pin 318 (dVdT) to the ground pin 320 (GND) defines the slew rate of the output voltage at power-on. The slew rate at start-up can be expressed as:

$$I_{dVdT} = \left(\frac{C_{dVdT}}{GAIN_{dVdT}}\right) * \left(\frac{dV_{OUT}}{dT}\right) \qquad (1)$$

where, $I_{dVdT}$=1 µA (typ.), $$\frac{dV_{OUT}}{dT} = \text{a desired output slew rate,}$$

and the $GAIN_{dVdT}$ is the dVdT-to-Out gain (e.g., a ratio of 12).

The total ramp time ($T_{dVdT}$) of output voltage $V_{OUT}$ for 0 volts to $V_{IN}$ can be calculated in accordance with:

$$T_{dVdT} = 8.3 * 10^4 * V_{IN} * C_{dVdT} \qquad (2)$$

where C is an external capacitor coupled to pin 318 (dVdT). The dVdT terminal (pin 318) is optionally not connected (e.g., "left floating") to obtain a predetermined slew rate of the output $V_{OUT}$. When pin 318 is left floating, the fast blocking switch 300 assumes a predetermined internal ramp rate of 12V/ms for the output voltage ($V_{OUT}$) ramp.

The fast blocking switch 300 monitors load current by sensing the voltage across the internal sensor 340 (e.g., a resistor). The FET current through switches 342 and 344 is monitored both during start-up operation and during normal operation. During (e.g., potential and/or actual) over-current events, the fast blocking switch 300 maintains the current level below a current limit threshold ($I_{OL}$) programmed by the external resistor $R_{ILIM}$ (e.g., coupled to the ILIM pin 326). The current limit is determined in accordance with:

$$I_{OL} = \frac{89\ k}{R_{ILIM}} \qquad (3)$$

A timer is optionally used to extend the time the fast blocking switch operates in a condition where the current exceeds the overload current limit (IOL).

The fast blocking switch 300 incorporates an input overvoltage protection circuit to protect the system (e.g., which includes the fast blocking switch 300) during over-voltage conditions. Coupling a first terminal of a resistor to the over-voltage protection (OVP) pin 314 terminal is used to program the fast blocking switch 300 over-voltage level. A voltage greater than $V_{OVPR}$ applied to the pin 314 turns off the FET switches 342 and 344. An internal resistor divider coupled between a supply and GND and having a center node coupled to the pin 314 programs the over-voltage threshold and provides the over-voltage protection for any downstream load. The pin 314 is tied to GND when not programming the overvoltage level.

The fault response (FTLb) pin 328 is open-drain output, which is asserted (active low) during undervoltage, over-voltage, reverse voltage/current and thermal shutdown conditions. Optionally, the pin 328 is asserted for over-current conditions when the over-current condition exceeds the length of a fault time-out period (TCBdly). The pin 328 is remains asserted until the fault condition is removed and the device resumes normal operation.

The fast blocking switch 300 includes current monitoring and reporting functions. The fast blocking switch 300 generates a scaled analog output current in response to the amount of current that is sensed passing through the switches 342 and/or 344. The output of pin 324 (IMON) is sourced by a current source that is arranged to be proportional to the current flowing from IN to OUT. Accordingly, the output of pin 324 is used by external power supply control logic to monitor current flow through the system.

An external pull-down resistor ($R_{IMON}$), which is connected from IMON terminal to GND, is used to programmably scale the current-limit. The voltage generated at this terminal (VIMON) is proportional to the current flowing through the switches 342 and 344. The maximum voltage range for monitoring the current ($V_{IMONMAX}$) is limited to VIN less 2.2V to ensure linear output and should not exceed 6.5V as absolute maximum. The maximum value of RIMON resistor is determined in accordance with the equations:

$$R_{IMON\_MAX} = \frac{V_{IN} - 2.2}{I_{OL} \times GAIN_{IMON}} \quad (4)$$

when $V_{IN}$<8.7V, and $$R_{IMON\_MAX} = \frac{6.5}{I_{OL} \times GAIN_{IMON}} \quad (5)$$

when $V_{IN}$>8.7V, and where $GAIN_{IMON}$ is a gain factor determined in accordance with the ratio of the indication of current of the pin 324 (IMON) to the current of the output pin (IOUT) 322.

The output voltage at pin 324 is calculated from the equation:

$$V_{IMON} = I_{OL} * GAIN_{IMON} * R_{IMON} \quad (6)$$

where $R_{IMON}$ is the pull-down resistor used to programmably scale the current-limit as described above.

The "power good threshold" (PGTH) pin 332 is coupled to a positive input of a "power good" comparator and can be coupled to an input signal for monitoring of either input or output of the fast blocking switch 300. The inverting input of the power good comparator is coupled to an internal reference voltage of 0.99V ($V_{PGTHR}$) for verifying a voltage of a signal coupled to the pin 332. The power good comparator has an output coupled to the "power good" (PGOOD) pin 330. The pin 330 provides an indication of power good comparator verification for co-ordination of status and control interface to "downstream" DC-DC converters and system monitoring circuits.

The pin 330 (PGOOD) provides an open-drain active high signal, which can be used to indicate the status of the monitored signal to downstream units. The pin 330 is asserted high when internal gate signal is off and the voltage on pin 332 (PGTH) is higher than the internal reference ($V_{PGTHR}$). The PGOOD signal has deglitch time incorporated to ensure gate is fully enhanced before a heavy load (e.g., by downstream power converters) is coupled to the pin 322 (OUT). A delay for the rising edge of the PGOOD signal is determined in accordance with the equations:

$$T_{PGOOD\_Degl} = 3.5 * 10^6 * C_{dVdT} \quad (7)$$

where $C_{dVdT}$ is the value of a capacitor coupled to the dVdT pin. When the result of equation (7) is less than default value $T_{PGOODDegl}$, a default value is used.

As discussed above, all terminals of the pin 322 (OUT) are connected together and to the load. The voltage of pin 322 ($V_{OUT}$) in the ON condition is dependent on the total ON resistance of the internal MOSFETs 342 and 344 ($R_{ON}$) is defined in accordance with the equation:

$$V_{OUT} = V_{IN} - (R_{ON} * I_{OUT}) \quad (8)$$

The ground (GND) pin 320 is normally the most negative voltage in the fast blocking switch and is used as a reference point against which other voltages are measured.

Figure 4:
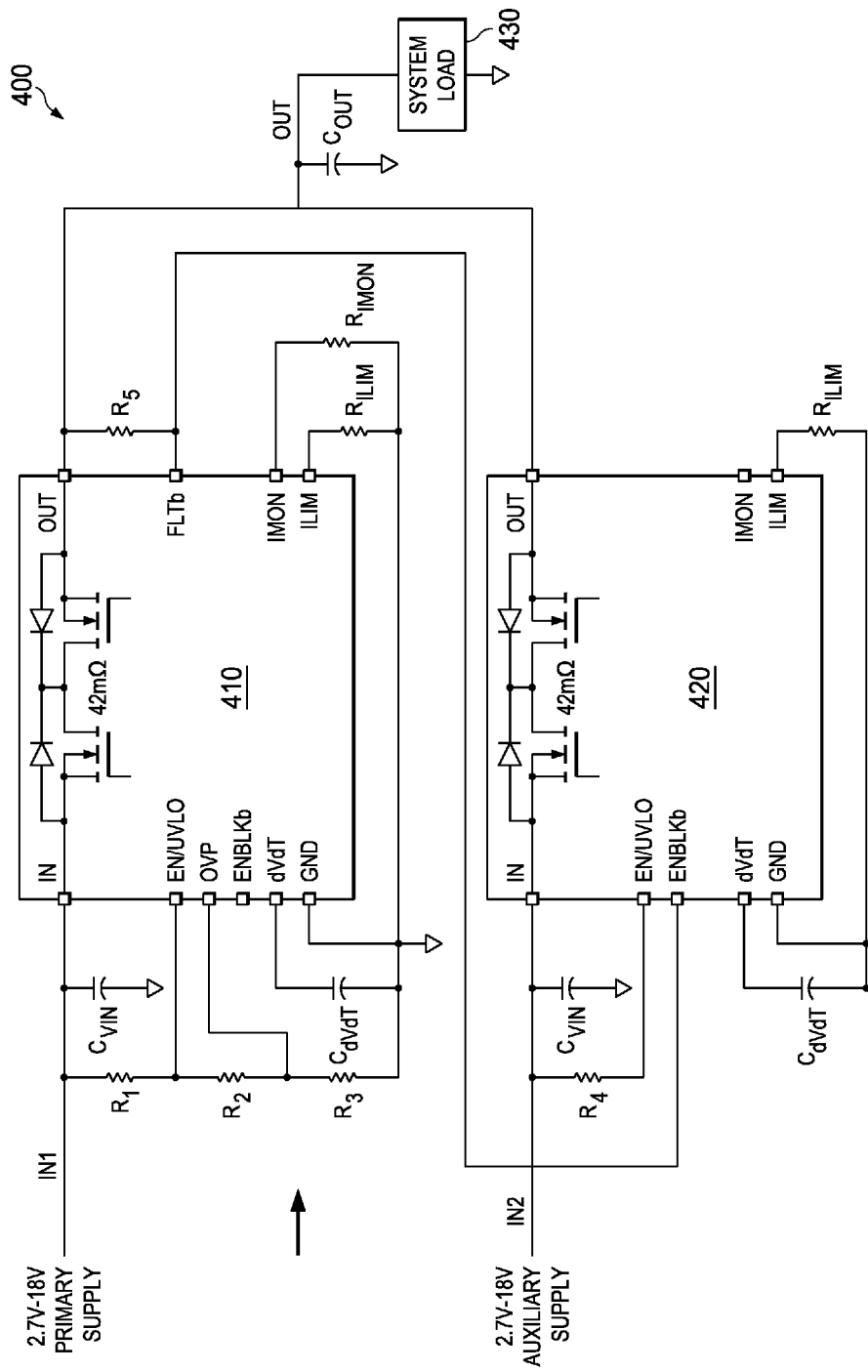
FIG. 4 is a block diagram of two wire-ORed fast blocking switches in accordance with example embodiments of the disclosure.

FIG. 4 is a block diagram of configuration of two wire-ORed fast blocking switches in accordance with example embodiments of the disclosure. Configuration 400 includes a fast blocking switch 410 and fast blocking switch 420 arranged in a wire-OR configuration where each of the OUT terminals are coupled together and are coupled to a system load 430 and/or capacitive load $C_{OUT}$.

Fast blocking switch 410 has an input (IN) that is coupled to the output of a primary power supply, while fast blocking switch 420 has input (IN) that is coupled to the output of an auxiliary power supply. Both the primary power supply and the auxiliary power supply participate to provide power when both switches 410 and 420 are in the ON state.

Fast blocking switch 410 is programmed and configured using external components $C_{VIN}$, $R_1$, $R_2$, $R_3$, and $R_5$, $C_{dVdT}$, $R_{ILIM}$, and $R_{IMON}$, while fast blocking switch 420 is programmed and configured using external components $C_{VIN}$, $R_4$, $C_{dVdT}$, and $R_{ILIM}$.

The output FLTb of the fast blocking switch 410 is coupled to the input ENBLKb of the fast blocking switch 420 in accordance with a blocking FET control mode. Such a configuration provides independent ON/OFF control for controlling internal blocking FETs (e.g., 342 and 344). The input ENBLKb is used in such power multiplexing applications to smoothly switch between master and slave (e.g., auxiliary) supplies (and vice-versa). The input ENBLKb is an active low terminal with internal pull-down. A high presented at the input ENBLKb turns-off the blocking FET, which prevents the reverse current conduction (from OUT to IN) through the fast blocking switch 420. When the blocking FET is disabled (e.g., in an OFF state), the overload current limit is set to 50 percent of current limit as determined by $R_{ILIM}$ resistor.

A fast reverse comparator optionally controls the internal blocking FET. The blocking FET is turned ON in less than 4 us (typical) when the forward voltage drop $V_{IN-OUT}$ exceeds 100 mV and is turned off in 1 us (typical) when $V_{IN-OUT}$ falls below −10 mV. When the blocking FET is turned ON, the ORed input supply experiences a momentary in-rush current drawn as the MOSFET turns on and charges the bus capacitance (e.g., $C_{OUT}$). In addition, the blocking FET can be independently turned ON or OFF through the ENBLKb pin.

Multiple fast blocking switches (e.g., 410 and 420) can be used to combine multiple power supplies to a common bus in an N+1 configuration. The N+1 power supply configuration is used where multiple power supplies are paralleled for either higher capacity, redundancy, or both. If N supplies are used to power the load, adding one or more extra identical units in parallel permits the load to continue operation in the event that any one of the N supplies fails. The fast blocking switches emulates the function of ORing diodes and provide protection such as rail isolation during hot-plugging, over-voltage, under-voltage, over-current, and short-circuit conditions.

In an embodiment, a controller (e.g., such as a microcontroller or a digital signal processor) is used to control one or more attributes of the fast blocking switches. Some of the variables are software programmable, which allows more flexibility for implementing the disclosed control schemes and provides an enhanced ability to adaptively adjust to dynamically changing conditions for optimized system performance. Other variables can be programmed during the manufacturing process (e.g., to compensate for lot characteristics) by trimming trim-able resistors to increase operational stability and accuracy.

In various embodiments, the above described components can be implemented in hardware or software, internally or externally, and share functionality with other modules and components as illustrated herein. For example, the switching portions of the fast blocking switch can be implemented outside of a device and/or substrate upon which the switch controller is formed.

The various embodiments described above are provided by way of illustration only and should not be construed to limit the claims attached hereto. Those skilled in the art will readily recognize various modifications and changes that could be made without following the example embodiments and applications illustrated and described herein, and without departing from the true spirit and scope of the following claims.

What is claimed is:

1. A circuit for limiting current, comprising:
   an energy storage device for storing a charge on an IC, the amount of energy stored being insufficient to turn on a first switch;
   the first switch being operable to couple input current to an output terminal in response to the coupling of charge stored in the energy storage device to a control terminal of the first switch; and
   a second switch operable to couple a limited amount of the input current to the output terminal in response to a predetermined current source coupled to a control terminal of the second switch the stored charge on the control terminal of the second switch being utilized to provide sufficient current to turn on the first switch, wherein the second switch is different from the first switch.

2. The circuit of claim 1, wherein the first and second switches are arranged in series.

3. The circuit of claim 2, wherein the first and second switches are field effect transistors (FETs).

4. The circuit of claim 3, wherein the first switch is operable to couple input current to the output terminal in response to the coupling of a potential supplied by the stored charge of the control terminal of the second switch.

5. The circuit of claim 4, wherein an input terminal, the output terminal, and the first and second switches are formed in a same substrate.

6. The circuit of claim 5 wherein the same substrate is an integrated circuit substrate.

7. The circuit of claim 5, wherein the energy storage device is a capacitor formed in the same substrate.

8. A circuit for limiting current, comprising: an energy storage device for storing a charge;
   a first switch operable to couple input current to an output terminal in response to the coupling of a potential supplied by the stored charge to a control terminal of the first switch; and
   a second switch operable to couple a limited amount of the input current to the output terminal in response to the coupling of a potential supplied by the stored charge to a control terminal of the second switch; wherein the second switch is different from the first switch, wherein the first and second switches are arranged in series and wherein the charge for storing and the input current are received at a first terminal.

9. The circuit of claim 8, comprising a controller operable to couple stored charge from the energy storage device to a control terminal of the first switch such that the first switch closes such that the input current flows through the first switch.

10. The circuit of claim 9, wherein the controller is operable to couple the stored charge from the energy storage device to the control terminal of the second switch, in response to a command for coupling together power from two different power supplies.

11. The circuit of claim 9, wherein the controller is operable to generate a pulse to momentarily couple stored charge from the source-to-gate capacitance of the second switch to the control terminal of the first switch such that the first switch turns on faster.

12. A system, comprising
    a first power supply; and
    a first fast blocking switch, comprising:
    an energy storage device for storing a charge;
    a first switch operable to couple input current from the first power supply to a first output terminal in response to the coupling of a potential supplied by the stored charge to a control terminal of the first switch; and
    a second switch operable to couple a limited amount of the input current to the output terminal in response to the coupling of a potential supplied by the stored charge to a control terminal of the second switch; wherein the second switch is different from the first switch.

13. The system of claim 12, wherein the first and second switches are arranged in series.

14. The system of claim 13, wherein the first and second switches are field effect transistors (FETs), and wherein the first switch is operable to couple input current to the first output terminal in response to the coupling of a potential supplied by a stored charge of the gate of the second switch.

15. The system of claim 12, comprising
    a second power supply; and
    a second fast blocking switch, comprising:
    an energy storage device for storing a charge;
    a third switch operable to couple input current from the second power supply to a second output terminal in response to the coupling of a potential supplied by the stored charge to a control terminal of the first switch, wherein the second output terminal is coupled to the first output terminal; and a fourth switch operable to couple a limited amount of the input current to the second output terminal in response to the coupling of a potential supplied by the stored charge to a control terminal of the second switch; wherein the second switch is different from the first switch.

16. The system of claim 15, wherein the first switch of the first blocking switch is operable to conduct current from the first power supply to the first output terminal while the second switch of the first fast blocking switch is turned off.

17. The system of claim 16, wherein the second switch of the first fast blocking switch is operable to control inrush current from the first power supply to the first output terminal.

18. A method, comprising:

storing a charge in an energy storage device;

using a first switch to couple input current to an output terminal in response to the coupling of a potential supplied by the stored charge to a control terminal of the first switch; and using a second switch operable to couple a limited amount of the input current to the output terminal in response to the coupling of a potential supplied by the stored charge to a control terminal of the second switch; wherein the second switch is different from the first switch;

further comprising storing charge on a gate of the second switch when the first switch is at least partially open.

19. The method of claim 18, comprising using the first switch to couple input current to the output terminal in response to the coupling of a potential supplied by a stored charge of the gate of the second switch.

* * * * *